(12) United States Patent
Hou et al.

(10) Patent No.: US 10,053,364 B2
(45) Date of Patent: Aug. 21, 2018

(54) HEAT TREATMENT METHOD AND THE PRODUCT PREPARED THEREFROM

(71) Applicant: Sunshine PV Corporation, Hukou Township (TW)

(72) Inventors: William Weijen Hou, Hukou Township (TW); Sheng Han Li, Hukou Township (TW); Tzu Pin Chen, Hukou Township (TW)

(73) Assignee: Sunshine PV Corporation, Hukou Township (TW)

( * ) Notice: Subject to any disclaimer, the term of this patent is extended or adjusted under 35 U.S.C. 154(b) by 250 days.

(21) Appl. No.: 14/832,385

(22) Filed: Aug. 21, 2015

(65) Prior Publication Data

US 2016/0052786 A1 Feb. 25, 2016

(30) Foreign Application Priority Data

Aug. 25, 2014 (TW) .............................. 103129205 A

(51) Int. Cl.
| | |
|---|---|
| *C01B 19/04* | (2006.01) |
| *C01B 19/00* | (2006.01) |
| *B05D 3/00* | (2006.01) |
| *B05D 7/00* | (2006.01) |
| *H01L 31/032* | (2006.01) |
| *H01L 31/18* | (2006.01) |
| *H01L 21/02* | (2006.01) |

(52) U.S. Cl.
CPC .............. *C01B 19/04* (2013.01); *B05D 3/007* (2013.01); *B05D 7/50* (2013.01); *C01B 19/007* (2013.01); *H01L 21/0256* (2013.01); *H01L 21/02422* (2013.01); *H01L 21/02491* (2013.01); *H01L 21/02562* (2013.01); *H01L 21/02568* (2013.01); *H01L 21/02614* (2013.01); *H01L 21/02667* (2013.01); *H01L 31/0322* (2013.01); *H01L 31/0326* (2013.01); *H01L 31/1828* (2013.01); *H01L 31/1836* (2013.01); *H01L 31/1872* (2013.01); *Y02E 10/541* (2013.01); *Y02E 10/543* (2013.01); *Y02P 70/521* (2015.11)

(58) Field of Classification Search
CPC ....... C01B 19/04; C01B 19/007; B05D 3/007; B05D 7/50
See application file for complete search history.

(56) References Cited

U.S. PATENT DOCUMENTS

| | | | |
|---|---|---|---|
| 3,850,574 A | * | 11/1974 | Namba .................. C21D 1/767 432/19 |
| 2010/0203668 A1 | | 8/2010 | Schmid et al. |
| 2010/0218814 A1 | | 9/2010 | Deligianni et al. |
| 2011/0088768 A1 | | 4/2011 | Gloeckler et al. |
| 2011/0117693 A1 | | 5/2011 | Palm et al. |
| 2013/0217176 A1 | | 8/2013 | Munteanu et al. |
| 2015/0107723 A1 | * | 4/2015 | Noh .......................... C23C 8/56 148/318 |

FOREIGN PATENT DOCUMENTS

| | | |
|---|---|---|
| TW | M413213 U | 10/2011 |
| WO | WO-2011135420 A1 | 11/2011 |

OTHER PUBLICATIONS

Extended European Search Report for Application No. 15182194.9, dated Dec. 23, 2015.

* cited by examiner

*Primary Examiner* — Jessee Roe
(74) *Attorney, Agent, or Firm* — Drinker Biddle & Reath LLP

(57) ABSTRACT

The present invention provides a heat treatment method, particularly a heat treatment method in which a protective layer is directly applied onto a precursor to ensure that the precursor on each portion of the substrate is treated based on substantially the same conditions so that the quality of the prepared product layer is improved. The method of the present invention comprises: (1) providing a substrate; (2) applying a precursor onto the surface of the substrate; (3) covering the precursor-applied substrate with a protective layer to bring the substrate and the protective layer into direct contact; (4) placing the substrate obtained from step (3) into a heat chamber for heat treatment; and (5) removing the protective layer. A product prepared by said heat treatment method is also provided.

9 Claims, 2 Drawing Sheets

HEAT TREATMENT METHOD AND THE PRODUCT PREPARED THEREFROM

CROSS-REFERENCE TO RELATED APPLICATIONS

This application claims priority to Taiwan (Republic of China) Application No. 103129205, filed Aug. 25, 2014, which is incorporated herein by reference in its entirety.

FIELD OF THE INVENTION

The present invention is related to a heat treatment method, particularly a heat treatment method in which a protective layer is directly applied onto a precursor to ensure that the precursor on each portion of the substrate is treated at substantially the same conditions so that the quality of the prepared product layer is improved.

BACKGROUND OF THE INVENTION

Heat treatment, which is commonly used in various technical fields, is a critical process for material growth, synthesis or modification. Generally, through heat treatment, elements or compounds in precursors are subjected to various physical or chemical reactions such as bond formation, diffusion, crystallization, recrystallization, dissociation and vaporization. The physical and chemical properties of products may be modified by adjusting the operational conditions in heat treatment methods such as temperature gradient, temperature holding duration, cooling rate, species of surrounding gas, gas pressure, gas flow or thermal flow. Such operational conditions in heat treatment are important and have a great influence on product properties. Particularly for commercialized products which are mass manufactured, such operational conditions are critical factors in a product's homogeneity and yield.

In order to investigate and obtain the suitable heat treatment conditions, numerous experiments and tests are needed. However, such experiments and tests are not only costly and time-consuming at the research stage but also usually require expensive equipment at the subsequent commercialization stage to control or maintain operational conditions. Especially for production related to heat treatment on large substrates such as solar panels, such issue becomes a major concern. It has become a primary objective for persons in the field of solar cells to develop a cost efficient heat treatment process that can produce products with homogeneous properties and improved yield.

Attempts were made in the prior art to improve the product yield and increase cost efficiency. For example, US 2011/0088768 A1 discloses the most preferable temperature for heat treatment for the targeted products; US 2010/0203668 A1 provides the most preferable heat profile, pressure and species of the surrounding gas for the heat treatment of metallic precursors; and TW M413213 provides an annealing chamber to optimize gas flow distribution. However, such technical means which are generally directed to the adjustment of heat treatment parameters still require a significant extent of equipment modification. Given the above, a different approach from such parameter adjustments is taken by the present invention. The present invention provides homogeneous products and achieves high stability and yield of product manufacture simply by applying a protective layer directly onto a precursor so that the precursor on each portion of the substrate is treated at substantially the same conditions.

SUMMARY OF THE INVENTION

In order to achieve the aforementioned objective, the present invention provides a method comprising: (1) providing a substrate; (2) applying a precursor onto a surface of the substrate; (3) covering the precursor-applied substrate with a protective layer to bring the substrate and the protective layer into direct contact; (4) placing the substrate obtained from step (3) into a heat chamber for heat treatment; and (5) removing the protective layer. The present invention also provides a product prepared by said heat treatment method which may be selenized copper-indium-gallium compounds, selenized copper-zinc-tin compounds or cadmium telluride compounds.

DETAILED DESCRIPTION OF THE INVENTION

Figure 1:
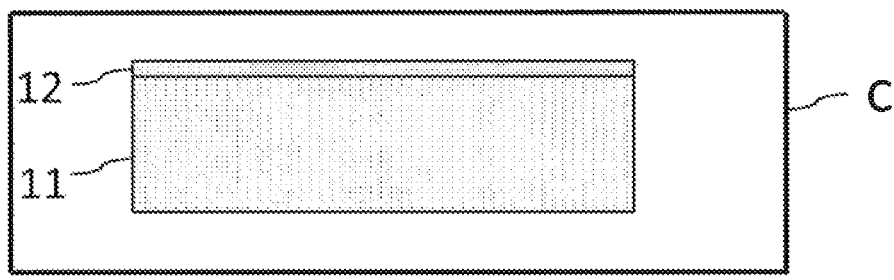
FIG. 1 is a schematic diagram illustrating a prior art heat treatment method.

The present invention provides a heat treatment method, comprising: (1) providing a substrate; (2) applying a precursor onto the surface of the substrate; (3) covering the precursor-applied substrate with a protective layer to bring the substrate and the protective layer into direct contact; (4) placing the substrate obtained from step (3) into a heat chamber for heat treatment; and (5) removing the protective layer. The manner in which the substrate obtained from step (3) is positioned in the heat chamber is not particularly limited. That is, the substrate obtained from step (3) can be placed in the heat chamber in any manner. Preferably, the substrate obtained from step (3) can be placed in the heat chamber in a manner such that the protective layer faces the top of the heat chamber. More preferably, the substrate obtained from step (3) can be placed in the heat chamber in a manner such that the protective layer is parallel to the top of the heat chamber. According to one embodiment of the present invention, additional metal layers, such as a molybdenum metal layer, can be added before the precursor is applied to increase the conductivity of the substrate.

According to one embodiment of the present invention, after the heat treatment step (4), the protective layer is removed in step (5) to obtain a product formed on the substrate. According to another embodiment of the present invention, steps (2) to (4) or steps (2) to (5) may be optionally repeated so that the product can be subjected to the heat treatment several times or a precursor which is the same as or different from that applied previously can be further applied onto the product already formed on the substrate.

According to one embodiment of the present invention, the precursor comprises one or more elements selected from the group consisting of Cu, In, Zn, Ga and Cd and at least one element of VIA group including O, S, Se and Te. The precursor is applied to the substrate by the following method: sequentially applying a plurality of layers, each comprising one different element; sequentially applying a plurality of layers, each comprising two or more elements; applying a single layer comprising multiple elements; or a combination thereof. The application of the precursor can be carried out by direct current magnetron sputtering, RF magnetron sputtering, thermal evaporation, co-evaporation, sputtering, chemical vapor deposition or coating.

According to one embodiment of the present invention, the heat treatment is carried out at a temperature ranging from room temperature to 1200° C., preferably at a temperature ranging from 300° C. to 1100° C., more preferably at 400° C. to 1000° C. The heat treatment of the present invention includes any operational techniques known in the art such as heating, temperature holding, cooling, annealing, quenching or tempering which may be carried out within the aforementioned temperature range. The heat treatment of the present invention may be carried out in a non-reactive gas such as nitrogen or an inert gas or under a low pressure.

According to one embodiment of the present invention, the protective layer withstands a high temperature and has excellent thermal conductivity. The protective layer may be a material consisting of carbon, a quartz glass or a ceramic material. The material consisting of carbon includes, but is not limited to, carbon fibers, carbon cloth, carbon tubes, carbon capsules, hollow carbon capsules or nano carbon capsules. The quartz glass may be any quartz glass known in the art such as a fused quartz glass and a synthetic quartz glass. The ceramic material may be any ceramic material known in the art such as $SiO_2$, $Al_2O_3$, $B_2O_3$, MgO, CaO, $Li_2O$, $K_2O$, $Na_2O$ or the like.

According to one embodiment of the present invention, the product prepared by the method of the present invention is a selenized copper-indium-gallium compound, selenized copper-zinc-tin compound, or cadmium telluride compound or the like.

Figure 2:
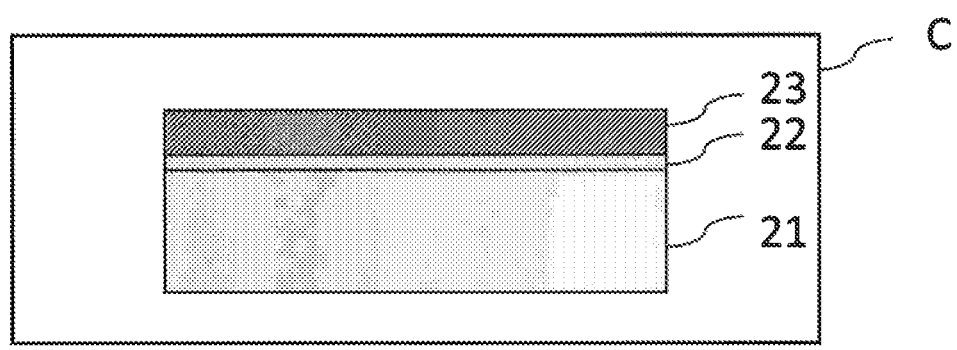
FIG. 2 is a schematic diagram illustrating a heat treatment method according to the present invention.

As shown in FIG. 1, in the prior art heat treatment method, a substrate (11) which is applied with a precursor (12) is placed in a heat chamber (C) in a manner such that the substrate directly exposes to the gas in the heat chamber. As shown in FIG. 2, in the heat treatment method of the present invention, a protective layer (23) is applied directly onto a precursor (22) on a substrate (21) to avoid any influence resulting from the gas flow or heat flow in the heat chamber (C) so that the property and quality of the product prepared thereby can be kept uniform. The substrate may be placed in the heat chamber in a manner such that the protective layer faces the top of the heat chamber Examples are provided below to further illustrate the use of a protective layer in the heat treatment method of the present invention, which are not intended to limit the scope of the present invention in terms of the species of precursors, the thickness of the layers, the method for forming the layers or the parameters related to the temperature, pressure or gas flow used in the heat treatment method. The extent of protection claimed by the subject application is based on the scope of the attached claims. Throughout this application, the term "about" is used to indicate that a specific value measured by a person skilled in the art includes inherent but acceptable deviation owing to the method used for determining the value.

EXAMPLES

Example 1

Molybdenum was applied onto a 1 $m^2 \times 3$ mm thick glass substrate by sputtering to form a molybdenum metal layer of a thickness of 500 nm. Copper, gallium and indium were sequentially applied by direct current sputtering to form a copper layer of a thickness of 300 nm, a gallium layer of a thickness of 100 nm and an indium layer of a thickness of 500 nm, and selenium was applied on the foregoing metallic layers by thermal evaporation to form a selenium layer of a thickness of 1000 nm as the precursor for growing selenized copper-indium-gallium selenide (CIGSe) compounds. A quartz glass having the same area as that of the glass substrate and a thickness of 2 mm was used to cover the precursor-applied glass substrate as a protective layer to obtain sample 1. Sample 1 was transported to the heat chamber for heat treatment. During the heat treatment, nitrogen with a gas flow of 50 slm was introduced into the heat chamber. The heat chamber was heated from room temperature to 500° C. with a temperature gradient of 50° C. to 70° C. per minute. The temperature was held at 500° C. for 10 minutes. The heat chamber was then cooled from 500° C. to room temperature with a temperature gradient of 50° C. to 100° C. per minute. After cooling, sample 1 was taken out from the heat chamber. The quartz glass was removed to obtain a homogeneous and well-crystallized CIGSe film on the glass substrate.

Example 2

Molybdenum was applied onto a 20 $cm^2 \times 1$ mm thick polyimide substrate by sputtering to form a molybdenum metal layer of a thickness of 500 nm. A mixture of copper, zinc, tin and selenium was applied onto the molybdenum metal layer by co-evaporation to form a 1000 nm thick layer as the precursor for growing selenized copper-zinc-tin-selenide (CZTSe) compounds. A graphite paper having an area slightly greater than that of the precursor-applied polyimide substrate and a thickness of 0.2 mm was used to cover the precursor-applied polyimide substrate as a protective layer to obtain sample 2. Sample 2 was placed directly onto a hot plate which was pre-heated to 380° C. and disposed in a nitrogen atmosphere to prevent the reactants from oxidation. After 10 minutes, sample 2 was removed from the hot plate. The graphite paper was removed to obtain a homogeneous and well-crystallized CZTSe film on the substrate.

Example 3

Aluminum doped zinc oxide was applied onto a 30 $cm^2 \times 3$ mm thick glass substrate by sputtering to form an aluminum doped zinc oxide layer of a thickness of 500 nm. Amorphous or poor-crystallized cadmium telluride (CdTe) was applied onto the aluminum-doped zinc oxide layer by sputtering to form a 2000 nm thick layer as the precursor. A ceramic aluminum oxide plate having the same area as that of the precursor-applied glass substrate and a thickness of 2 mm was used to cover the precursor-applied glass substrate as a protective layer to obtain sample 3. Sample 3 was transported to the heat chamber for recrystallization heat treatment. During the recrystallization heat treatment, nitrogen with a gas flow of 20 slm was introduced into the heat chamber. The heat chamber was heated from the room temperature to 450° C. with a temperature gradient of 50° C. to 70° C. per minute. The temperature was held at 450° C. for 30 minutes. The heat chamber was then cooled from 450° C. to the room temperature with a temperature gradient of 50° C. to 100° C. per minute. After cooling, sample 3 was taken out from the heat chamber. The ceramic aluminum oxide plate was removed to obtain a homogeneous and well-crystallized cadmium telluride film on the glass substrate.

What is claimed is:

1. A heat treatment method, comprising the following steps:
   (1) providing a substrate;
   (2) applying a precursor onto a surface of the substrate;
   (3) covering the precursor-applied substrate with a protective layer to bring the substrate and the protective layer into direct contact;
   (4) placing the substrate obtained from step (3) into a heat chamber for heat treatment; and
   (5) removing the protective layer;
   wherein the substrate obtained from step (3) is placed in the heat chamber in a manner such that the protective layer faces the top of the heat chamber.

2. The method according to claim 1, wherein steps (2) to (4) or steps (2) to (5) are repeated.

3. The method according to claim 2, wherein the precursor comprises one or more elements selected from the group consisting of Cu, In, Zn, Sn, Ga and Cd and at least one element of VIA group.

4. The method according to claim 1, wherein the heat treatment is carried out at a temperature ranging from room temperature to 1200° C.

5. The method according to claim 4, wherein the precursor comprises one or more elements selected from the group consisting of Cu, In, Zn, Sn, Ga and Cd and at least one element of VIA group.

6. The method according to claim 1, wherein the protective layer is a material consisting of carbon, a quartz glass or a ceramic material.

7. The method according to claim 6, wherein the precursor comprises one or more elements selected from the group consisting of Cu, In, Zn, Sn, Ga and Cd and at least one element of VIA group.

8. The method according to claim 1, wherein the precursor is applied to the substrate by the following method: sequentially applying a plurality of layers, each comprising one different element; sequentially applying a plurality of layers, each comprising two or more elements; applying single layer comprising multiple elements; or a combination thereof.

9. The method according to claim 1, wherein the precursor comprises one or more elements selected from the group consisting of Cu, In, Zn, Sn, Ga and Cd and at least one element of VIA group.

* * * * *